United States Patent
Zawodny et al.

(10) Patent No.: US 9,959,923 B2
(45) Date of Patent: May 1, 2018

(54) APPARATUSES AND METHODS TO REVERSE DATA STORED IN MEMORY

(71) Applicant: Micron Technology, Inc., Boise, ID (US)

(72) Inventors: Jason T. Zawodny, Eagle, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 15/098,707

(22) Filed: Apr. 14, 2016

(65) Prior Publication Data
US 2016/0306584 A1 Oct. 20, 2016

Related U.S. Application Data

(60) Provisional application No. 62/148,503, filed on Apr. 16, 2015.

(51) Int. Cl.
*G11C 7/00* (2006.01)
*G11C 11/4091* (2006.01)
(Continued)

(52) U.S. Cl.
CPC ........ *G11C 11/4091* (2013.01); *G11C 11/408* (2013.01); *G11C 11/4097* (2013.01);
(Continued)

(58) Field of Classification Search
CPC .................................................... G11C 7/1006
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Dybdahl, et al., "Destructive-Read in Embedded DRAM, Impact on Power Consumpton," Apr. 2006, (10 pgs.), vol. 2, Issue 2, Journal of Embedded Computing Issues in embedded single-chip multicore architectures.
(Continued)

*Primary Examiner* — Son Mai
(74) *Attorney, Agent, or Firm* — Brooks, Cameron & Huebsch, PLLC

(57) ABSTRACT

Apparatuses and methods are provided for reversing data stored in memory. An example apparatus comprises an array of memory cells, a first plurality of sensing components corresponding to a respective first plurality of columns of the array, a second plurality of sensing components corresponding to a respective second plurality of columns of the array, and a plurality of shared input/output (I/O) lines (which may be referred to as SIO lines). Each one of the plurality of SIO lines can be selectively coupled to a respective subset of the first plurality of sensing components and to a respective subset of the second plurality of sensing components. The apparatus can include a controller configured to control reversing a logical sequence of data stored in a group of memory cells coupled to a first access line of the array by performing a plurality of transfer operations via the plurality of SIO lines.

27 Claims, 7 Drawing Sheets

(51) Int. Cl.
*G11C 16/28* (2006.01)
*G11C 11/408* (2006.01)
*G11C 11/4097* (2006.01)
*G11C 7/10* (2006.01)
*G11C 11/4096* (2006.01)

(52) U.S. Cl.
CPC ............ *G11C 16/28* (2013.01); *G11C 7/1006* (2013.01); *G11C 11/4096* (2013.01); *G11C 2211/4013* (2013.01)

(58) Field of Classification Search
USPC .................................................. 365/189.17
See application file for complete search history.

(56) References Cited

U.S. PATENT DOCUMENTS

| | | |
|---|---|---|
| 4,435,793 A | 3/1984 | Ochil |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,692,466 B2 | 4/2010 | Ahmadi |
| 7,685,365 B2 | 5/2010 | Rajwar et al. |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |

(56) References Cited

U.S. PATENT DOCUMENTS

| | | |
|---|---|---|
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,019,785 B2 * | 4/2015 | Cowles .................. G11C 19/00 365/189.17 |
| 9,047,193 B2 | 6/2015 | Lin et al. |
| 9,165,023 B2 | 10/2015 | Moskovich et al. |
| 9,257,173 B2 * | 2/2016 | Ishizu .................. G11C 11/412 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perrier |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0178053 A1 | 7/2008 | Gorman et al. |
| 2008/0215937 A1 | 9/2008 | Dreibelbis et al. |
| 2008/0165601 A1 | 12/2008 | Matick et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 * | 11/2012 | Rao .................. G11C 7/1048 365/189.05 |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Sec |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |

(56) References Cited

U.S. PATENT DOCUMENTS

FOREIGN PATENT DOCUMENTS

| EP | 2026209 | 2/2009 |
|---|---|---|
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pafiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Elliot, et al., "Computational RAM: Implementing Processors in Memory", Jan.-Mar. 1999, (10 pgs.), vol. 16, Issue 1, IEEE Design and Test of Computers Magazine.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

\* cited by examiner

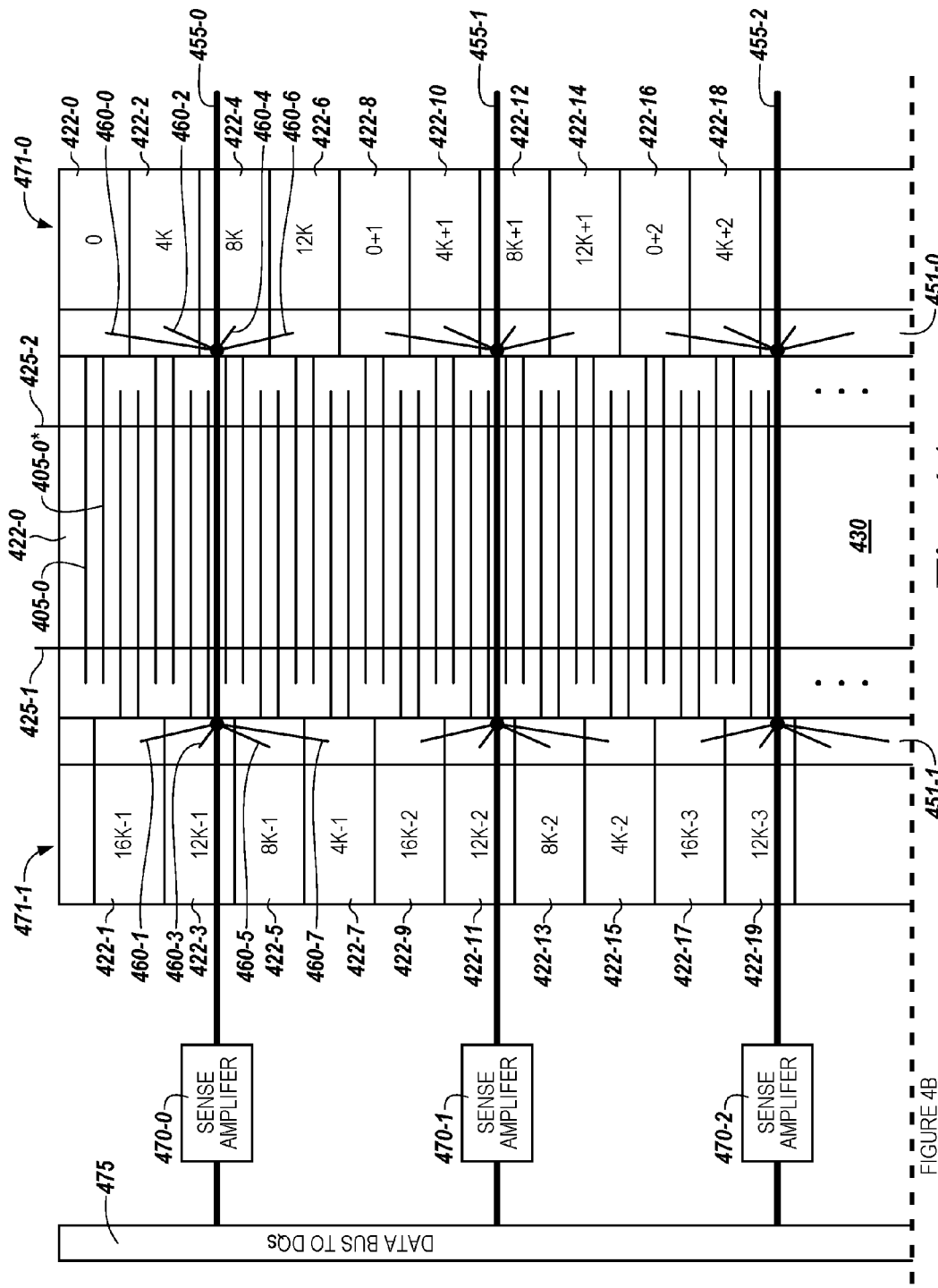

| PHYSICAL 592 | 0 | 1 | 2 | 3 | 4 | 5 | 6 | 7 | ... | N-8 | N-7 | N-6 | N-5 | N-4 | N-3 | N-2 | N-1 |
|---|---|---|---|---|---|---|---|---|---|---|---|---|---|---|---|---|---|
| LOGICAL 594 | 0 | 16K-1 | 4K | 12K-1 | 8K | 8K-1 | 12K | 4K-1 | ... | 2K-1 | 14K | 6K-1 | 10K | 10K-1 | 6K | 14K-1 | 2K |
| DATA 596-1 | $D_0$ | $D_1$ | $D_2$ | $D_3$ | $D_4$ | $D_5$ | $D_6$ | $D_7$ | ... | $D_{N-8}$ | $D_{N-7}$ | $D_{N-6}$ | $D_{N-5}$ | $D_{N-4}$ | $D_{N-3}$ | $D_{N-2}$ | $D_{N-1}$ |

590-1

| PHYSICAL 592 | 0 | 1 | 2 | 3 | 4 | 5 | 6 | 7 | ... | N-8 | N-7 | N-6 | N-5 | N-4 | N-3 | N-2 | N-1 |
|---|---|---|---|---|---|---|---|---|---|---|---|---|---|---|---|---|---|
| LOGICAL 594 | 0 | 16K-1 | 4K | 12K-1 | 8K | 8K-1 | 12K | 4K-1 | ... | 2K-1 | 14K | 6K-1 | 10K | 10K-1 | 6K | 14K-1 | 2K |
| DATA 596-2 | $D_1$ | $D_0$ | $D_3$ | $D_2$ | $D_5$ | $D_4$ | $D_7$ | $D_6$ | ... | $D_{N-7}$ | $D_{N-8}$ | $D_{N-5}$ | $D_{N-6}$ | $D_{N-3}$ | $D_{N-4}$ | $D_{N-1}$ | $D_{N-2}$ |

APPARATUSES AND METHODS TO REVERSE DATA STORED IN MEMORY

PRIORITY INFORMATION

This application claims the benefit of U.S. Provisional Application No. 62/148,503, filed Apr. 16, 2015, the contents of which are included herein by reference.

TECHNICAL FIELD

The present disclosure relates generally to semiconductor memory and methods, and more particularly, to apparatuses and methods related to reversing an order of bits in a memory array or subarray.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

BRIEF DESCRIPTION OF THE DRAWINGS

FIG. 5 provides tables illustrating logical indices of data stored in an array before and after reversing data stored in memory in accordance with a number of embodiments of the present disclosure.

DETAILED DESCRIPTION

Figure 1:
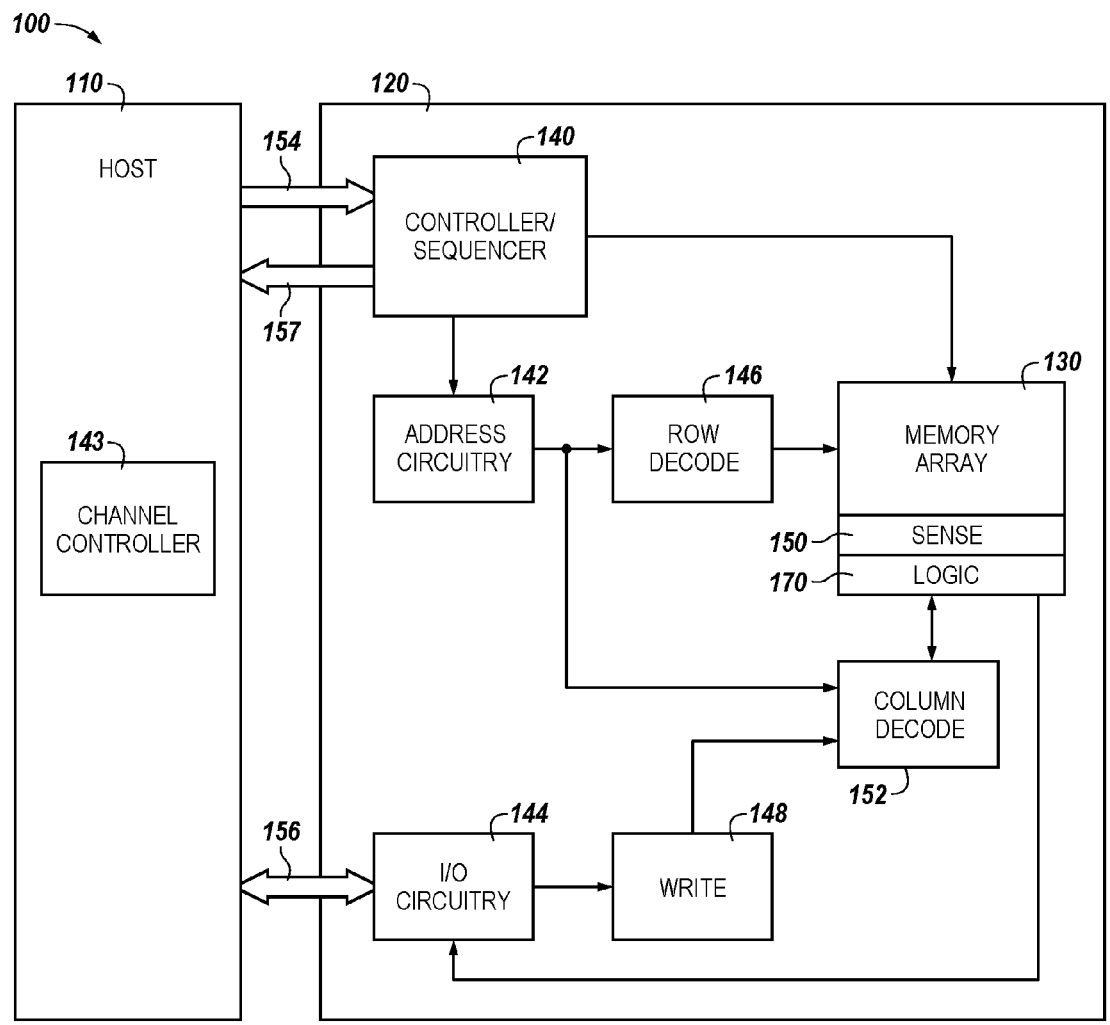
FIG. 1 is a block diagram of an apparatus in the form of an electronic system including a memory device in accordance with a number of embodiments of the present disclosure.

The present disclosure includes apparatuses and methods related to reversing data stored in memory. A number of embodiments include an apparatus comprising an array of memory cells, a first plurality of sensing components corresponding to a respective first plurality of columns of the array, a second plurality of sensing components corresponding to a respective second plurality of columns of the array, and a plurality of shared input/output (I/O) lines (which may be referred to as SIO lines). Each one of the plurality of SIO lines can be selectively coupled to a respective subset of the first plurality of sensing components and to a respective subset of the second plurality of sensing components. The apparatus can include a controller configured to control reversing a logical sequence of data stored in a group of memory cells coupled to a first access line of the array by performing a plurality of transfer operations via the plurality of SIO lines.

A number of embodiments of the present disclosure can facilitate reversing data stored in memory in a more efficient manner as compared to previous approaches. As used herein, reversing data refers reversing a logical sequence (e.g., order) of a stored data pattern. Reversing a stored data pattern can include writing the (reversed) data pattern back to a same group of memory cells in which the (nonreversed) data pattern was initially stored (e.g., a group of cells coupled to a same access line, which may be referred to herein as a "word line" or a "row"); however, embodiments are not so limited. For instance, reversing a stored data pattern can include writing the reversed data pattern to a group of cells other than the group of cells in which the nonreversed data pattern was initially stored (e.g., the reversed data pattern can be written to a group of cells coupled to a different word line). As such, reversing data includes storing data in a manner such that a data unit (e.g., bit) corresponding to a first logical index (e.g., logical index "0" if a zero-based numbering convention is used) is stored so as to correspond to a last logical index (e.g., logical index "N−1" if N represents the total number of bits in a sequence), a data unit corresponding to the last logical index (e.g., logical index "N−1") is stored so as to correspond to the first logical index (e.g., logical index "0"), the data unit corresponding to the second logical index (e.g., logical index "1") is stored so as to correspond to the next to last logical index (e.g., logical index "N−2"), and so on. As used herein, a "logical index" refers to a logical address associated with a particular data unit.

A number of embodiments can include reversing the data corresponding to an entire row of a memory array in a faster and/or more efficient manner as compared to prior approaches. For example, consider a memory array comprising 16K (e.g., 16,000) columns (e.g., 16K sense lines or complementary sense line pairs, which may be referred to herein as "digit lines") such that each row stores 16K data units (e.g., bits). In accordance with a number of embodiments, a number of shared input/output (I/O) lines can be utilized to reverse the entire 16K bits corresponding to a particular row via a number of transfer operations. As described further herein, the transfer operations can include swapping data values between subsets of sensing components selectively coupled to respective SIO lines. The number of transfer operations can depend on the number of SIO lines corresponding to the array. In a number of embodiments, the number of SIO lines correlates to the number of sensing components selectively coupled to each of the respective SIO lines (with each one of the number of sensing components corresponding to a respective one of the columns). For instance, in this example, if the number of array columns is N (e.g., 16K) and each SIO line is selectively coupled to eight sensing components, then the number of SIO lines is 2K (e.g., 16K columns divided by 8 sensing components per SIO line). Similarly, if the number of SIO lines is "M", then the number of sensing components per SIO line is "N/M". That is, if M is 4K, then the number of sensing components per SIO line would be 4 (e.g., 16K columns divided by 4K SIO lines). Embodiments are not limited to these examples. As used herein, the quantity "16K" can refer 16,384 (e.g., $2^{14}$), "4K" can refer to 4,096 (e.g., $2^{12}$), "2K" can refer 2,048 (e.g., $2^{11}$), etc. That is, "K" can represent the binary multiplier $2^{10}$ (e.g., 1024).

Previous approaches to reversing data stored in memory often involve moving subsets of the data to be reversed (e.g., bytes, words, etc.) out of the array to an external processing resource (e.g., a scalar processor). The external processing resource(s) can reverse the data and then the reversed data can be further operated on by the external processing resource and/or can be written back to the array. As such, it can be cumbersome to perform data reversal processes on large data sets (e.g., data of an entire row) in accordance with previous approaches.

A number of embodiments of the present disclosure can provide improved parallelism and/or reduced power consumption in association with reversing data stored in memory as compared to previous systems such as previous PIM systems and systems having an external processor (e.g., a processing resource located external from a memory array, such as on a separate integrated circuit chip).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of an electronic system 100 including a memory device 120 in accordance with a number of embodiments of the present disclosure. As used herein, a memory device 120, memory controller 140, channel controller 143, memory array 130, sensing circuitry 150, including sensing components, and peripheral logic 170 might each also be separately considered an "apparatus."

In this example, the system 100 includes a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1, embodiments are not so limited. For instance, memory device 120 may include a number of memory arrays 130 (e.g., a number of banks of DRAM cells, NAND flash cells, etc.).

The memory device 120 includes address circuitry 142 to latch address signals provided over an address/control bus 154 (e.g., an address/control bus from the host 110). Address signals are received by address circuitry 142 and decoded by row decode circuitry 146 and column decode circuitry 152 to access the memory array 130. Although the address/control bus 154 is shown as a single bus, the bus 154 can comprise separate address and control busses. The column decode circuitry 152 can comprise logic (e.g., multiplexor circuitry) to selectively couple shared I/O lines (e.g., SIO line 355 shown in FIG. 3) to subsets of sensing components in association with reversing data stored in memory in accordance with embodiments described herein. The shared I/O (SIO) lines can provide an increased data path size (e.g., width) as compared to previous data paths used to move data from the array 130 (e.g., via a data bus such as data bus 475 shown in FIG. 4A/4B) to DQ pads, for instance, among other benefits. For instance, in a number of embodiments, the SIO lines may serve as both local I/O lines and global I/O lines corresponding to array 130, which can facilitate moving data between subarrays (e.g., portions of a memory array being coupled to separate sensing circuitry stripes).

Data can be sensed (read) from memory array 130 by sensing voltage and/or current changes on digit lines using a number of sensing components (e.g., sense amplifiers) of the sensing circuitry 150. A sense amplifier can read and latch a page (e.g., a row) of data from the memory array 130. As described further herein, the sensing components of the sensing circuitry 150 can comprise respective sense amplifiers and corresponding compute components coupled thereto that can be used to sense, store (e.g., cache and/or buffer), and move data, for instance. The I/O circuitry 144 can be used for bi-directional data communication with host 110 over the data bus 156 (e.g., DQ connections). The write circuitry 148 can be used to write data to the memory array 130.

Memory controller 140, which can serve as a sequencer, can decode control signals (e.g., commands) provided by address/control bus 154 from the host 110. These signals can include chip enable signals, write enable signals, and address latch signals that can be used to control operations performed on the memory array 130, including data sense, data store, data move, data write, and data erase operations, among other operations. The memory controller 140 can be responsible for executing instructions from the host 110 and/or accessing the memory array 130. The memory controller 140 can be a state machine, a sequencer, or some other type of controller and can be implemented in hardware, software, firmware, and/or combinations thereof. In the example shown in FIG. 1, system 100 includes a bus 157 which can provide, for example, status and exception information from the memory controller 140 to a channel controller 143.

Examples of the sensing circuitry 150 are described further below (e.g., in FIGS. 2 and 3). For instance, in a number of embodiments, the sensing circuitry 150 can include a number of sense amplifiers and corresponding compute components, which may serve as an accumulator and can be used to perform logical operations (e.g., on data associated with complementary sense lines). The sensing circuitry 150 can be used to reverse data stored in memory (e.g., in array 130) in accordance with embodiments described herein.

In a number of embodiments, the sensing circuitry 150 can also be used to perform logical operations (e.g., logical functions such as AND, OR, NOT, NOR, NAND, XOR, etc.) using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on memory controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral logic 170, which can include an additional number of sense amplifiers, can be coupled to the sensing circuitry 150. The sensing circuitry 150 and the peripheral logic 170 can cooperate in performing logical operations and/or in reversing data stored in memory, according to a number of embodiments described herein.

As such, in a number of embodiments, circuitry external to memory array 130 and sensing circuitry 150 is not needed to reverse data stored in memory array 130 and/or to perform compute functions as the sensing circuitry 150 can perform the appropriate operations in order to perform such data reversal and/or compute functions without the use of an external processing resource. Therefore, the sensing circuitry 150 may be used to complement and to replace, at least to some extent, such an external processing resource (or at least the bandwidth consumption of such an external processing resource).

Figure 2:
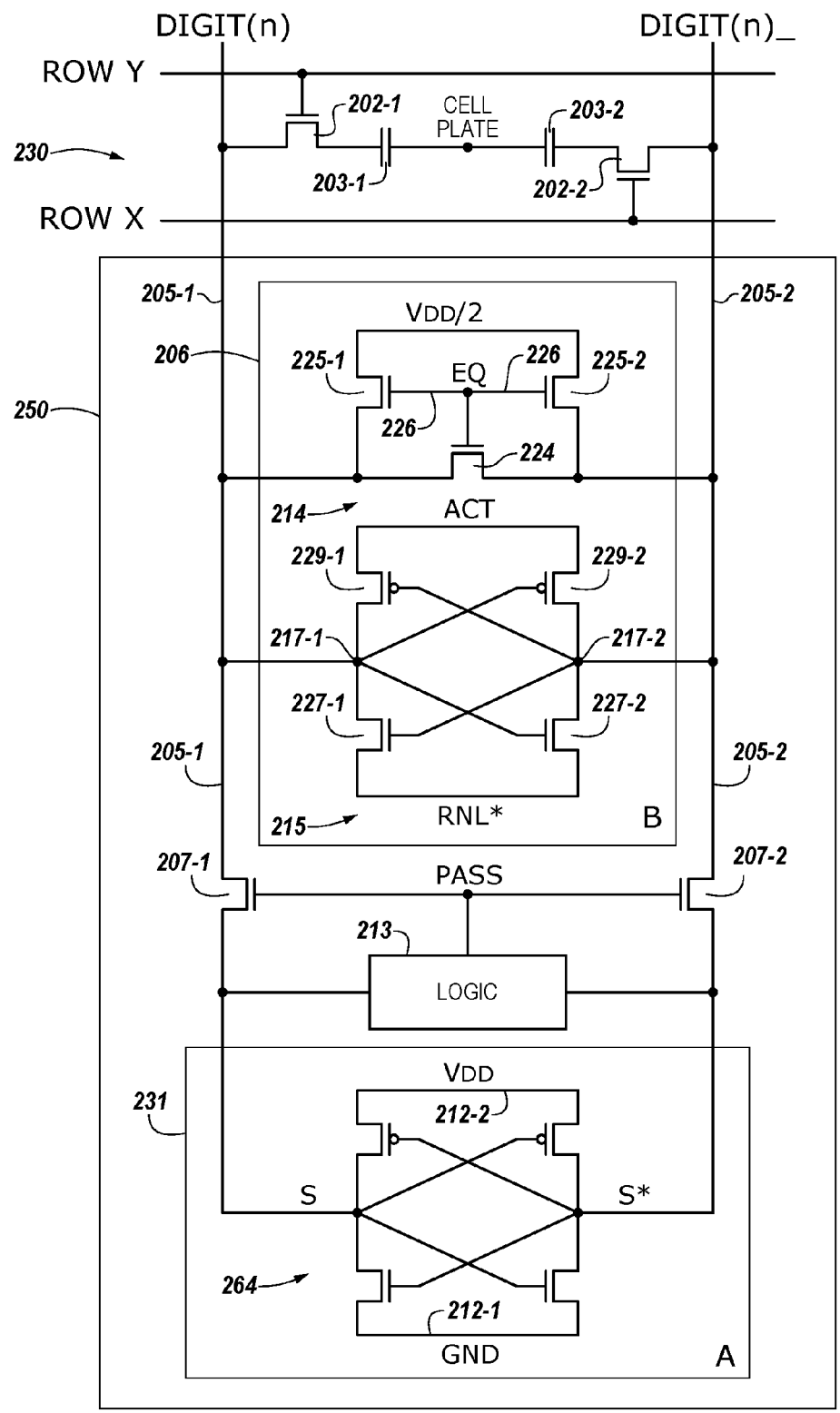
FIG. 2 is a schematic diagram illustrating a portion of a memory array including sensing circuitry in accordance with a number of embodiments of the present disclosure.

FIG. 2 is a schematic diagram illustrating a portion of a memory array 230 including sensing circuitry in accordance with a number of embodiments of the present disclosure. The sensing component 250 represents one of a number of sensing components that can correspond to sensing circuitry 150 shown in FIG. 1.

In the example shown in FIG. 2, the memory array 230 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 202-1 and capacitor 203-1, and a second memory cell comprises transistor 202-2 and capacitor 203-2, etc. In a number of embodiments, the memory cells may be destructive read memory cells (e.g., reading the data stored in the cell destroys the data such that the data originally stored in the cell is refreshed after being read).

Figure 3:
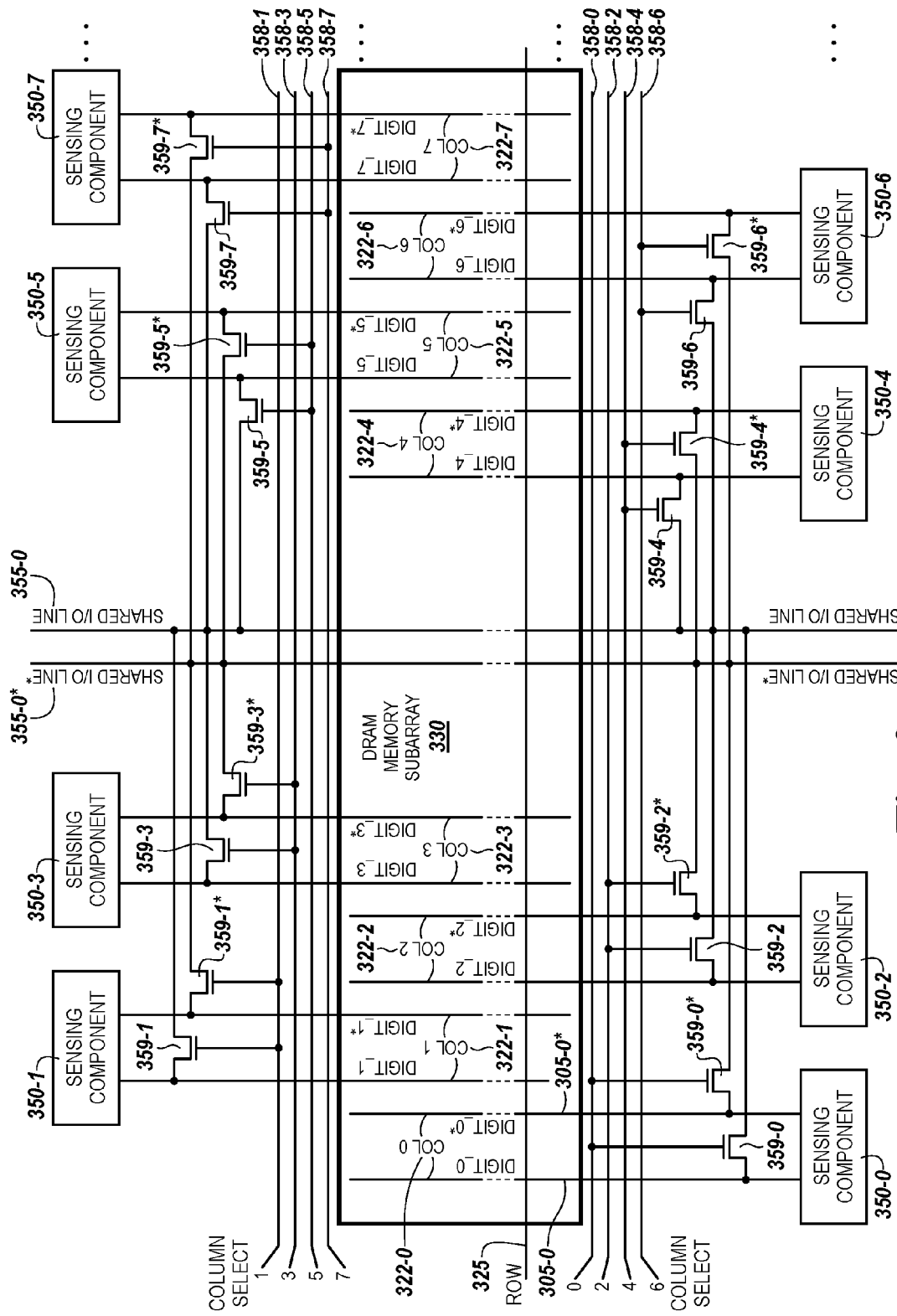
FIG. 3 is a schematic diagram illustrating a portion of a memory array including sensing circuitry that can be operated to reverse data stored in memory accordance with a number of embodiments of the present disclosure.

The cells of the memory array 230 can be arranged in rows coupled by access lines 204-X (Row X), 204-Y (Row Y), etc., and columns coupled by pairs of complementary sense lines (e.g., digit lines 205-1 labelled DIGIT(n) and 205-2 labelled DIGIT(n)_0* in FIG. 2 and digit lines 305-0 labelled DIGIT _0 and 305-0* labelled DIGIT_0* in FIG. 3). Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 202-1 is coupled to digit line 205-1, a second source/drain region of transistor 202-1 is coupled to capacitor 203-1, and a gate of transistor 202-1 is coupled to word line 204-Y. A first source/drain region of transistor 202-2 is coupled to digit line 205-2, a second source/drain region of transistor 202-2 is coupled to capacitor 203-2, and a gate of transistor 202-2 is coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The digit lines 205-1 and 205-2 of memory array 230 are coupled to sensing component 250 in accordance with a number of embodiments of the present disclosure. In this example, the sensing component 250 comprises a sense amplifier 206 and a compute component 231 corresponding to a respective column of memory cells (e.g., coupled to a respective pair of complementary digit lines). The sense amplifier 206 is coupled to the pair of complementary digit lines 205-1 and 205-2. The compute component 231 is coupled to the sense amplifier 206 via pass gates 207-1 and 207-2. The gates of the pass gates 207-1 and 207-2 can be coupled to selection logic 213.

The selection logic 213 can include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The selection logic 213 can be coupled to the pair of complementary digit lines 205-1 and 205-2 and configured to perform logical operations on data stored in array 230. For instance, the selection logic 213 can be configured to control continuity of (e.g., turn on/turn off) pass gates 207-1 and 207-2 based on a selected logical operation that is being performed.

The sense amplifier 206 can be operated to determine a data value (e.g., logic state) stored in a selected memory cell. The sense amplifier 206 can comprise a cross coupled latch 215 (e.g., gates of a pair of transistors, such as n-channel transistors 227-1 and 227-2 are cross coupled with the gates of another pair of transistors, such as p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of digit lines 205-1 or 205-2. An ACT signal and an RNL* signal can be driven low to enable (e.g., fire) the sense amplifier 206. The digit line 205-1 or 205-2 having the lower voltage will turn on one of the transistors 229-1 or 229-2 to a greater extent than the other of transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage $V_{CC}$ through a source transistor, and the other digit line 205-1 or 205-2 is driven to the voltage of the reference voltage (e.g., ground) through a sink transistor. Therefore, the cross coupled transistors 227-1 and 227-2 and transistors 229-1 and 229-2 serve as a sense amplifier pair, which amplify the differential voltage on the digit lines 205-1 and 205-2 and operate to latch a data value sensed from the selected memory cell.

Embodiments are not limited to the sensing component configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

As described further below, the sensing component 250 can be one of a plurality of sensing components selectively coupled to a shared I/O line (e.g., SIO line 355 shown in FIG. 3). As such, the sensing component 250 can be used in association with reversing data stored in memory in accordance with a number of embodiments of the present disclosure.

In this example, the sense amplifier 206 includes equilibration circuitry 214, which can be configured to equilibrate the digit lines 205-1 and 205-2. The equilibration circuitry 214 comprises a transistor 224 coupled between digit lines 205-1 and 205-2. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 is coupled to digit line 205-1, and a second source/drain region of transistor 225-2 is coupled to digit line 205-2. Gates of transistors 224, 225-1, and 225-2 can be coupled together and to an equilibration (EQ) control signal line 226. As such, activating EQ enables the transistors 224, 225-1, and 225-2, which effectively shorts digit lines 205-1 and 205-2 together and to the equilibration voltage (e.g., $V_{DD}/2$). Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

FIG. 3 is a schematic diagram illustrating a portion of a memory array 330 including sensing circuitry that can be operated to reverse data stored in memory accordance with a number of embodiments of the present disclosure. In this example, the array 330 is a subarray of DRAM memory cells; however, embodiments are not so limited. As used herein, a subarray can refer to a portion of a memory array coupled to a respective "stripe" of sensing components. For example, a memory array "bank" may comprise a plurality of subarrays, with each subarray corresponding to a one of a respective plurality of sensing stripes.

The example shown in FIG. 3 includes eight sensing components 350-0, 350-1, . . . , 350-7 of a sensing component stripe. Each of the sensing components 350-0 to 350-7 is coupled to a pair of complementary sense lines (e.g., 305-0 (DIGIT _0 and 305-1 (DIGIT_0*) and corresponds to a respective column 322-0 to 322-7 of the array. The sensing components 350-0 to 350-7 can be sensing components such as those shown in FIG. 2.

In a number of embodiments, and as shown in FIG. 3, the array 330 has a folded digit line architecture and the sensing components 350-0 to 350-7 (which may be referred to generally as sensing components 350) are interleaved such that sensing components corresponding to physically adjacent columns are located on opposite sides of the array 330. For instance, in this example, the sensing components are interleaved such that sensing components corresponding to even numbered columns (e.g., 322-0, 322-2, 322-4, and 322-6) are arranged on one side of the array 330 (e.g., on the bottom as shown in FIG. 3) and sensing components corresponding to odd numbered columns (e.g., 322-1, 322-3, 322-5, and 322-7) are arranged on the opposite side of the array 330 (e.g., on the top as shown in FIG. 3).

The sensing components 350-0 to 350-7 are selectively coupled to an SIO line, which is referred to generally as an SIO line 355. As such, in this example, the SIO line 355 is selectively coupled to eight sensing components 350. In this example, the SIO line 355 comprises a pair of complementary SIO lines 355-0 (e.g., SHARED I/O LINE) and 355-0* (e.g., SHARED I/O LINE*). The sensing components 350-0 to 350-7 are selectively coupled to the SIO line 355 via column decode circuitry (e.g., column decode circuitry 152 shown in FIG. 1). As such, the column decode circuitry can be used to select which one of the eight sensing components is coupled to the SIO line 355 at a particular time.

In this example, the column decode circuitry comprises pairs of select devices (e.g., transistors) 359-0/359-0* to 359-7/359-7* whose gates are coupled to corresponding respective column select lines 358-0 to 358-7. For instance, column select line 358-0 (e.g., column select line 0) is coupled to the gates of select devices 359-0 and 359-0*. As shown in FIG. 3, each of the select devices (referred to generally as 359) is coupled between a sense line corresponding to a particular column 322 and the shared I/O line 355. For instance, select device 359-0 is coupled between sense line 305-0 corresponding to column 322-0 and SIO line 355-0, and select device 359-0* is coupled between complementary sense line 305-0* and complementary SIO line 355-0*. As such, an activation signal (e.g., voltage) can be provided to a selected one of column select lines 358-0 to 358-7 in order to transfer a data value from the digit lines corresponding to a particular column 322 to the SIO line 355, and vice versa. In this manner, a data value stored in a memory cell coupled to a particular column 322 of the array 330 can be sensed via a corresponding sensing component 350, can be transferred to the SIO line 355 (e.g., via activation of the column select line 358 corresponding to the particular column 322), can be transferred from the SIO line 355 to a sensing component 350 corresponding to a different column 322 (e.g., via activation of the column select line 358 corresponding to the different column 322), and can be stored in a memory cell coupled to the different column. As described further herein, a number of transfer operations via SIO lines (e.g., 355) can be performed in association with reversing data stored in memory in accordance with a number of embodiments of the present disclosure.

Embodiments are not limited to the example shown in FIG. 3. For instance, as described above, embodiments can include arrays comprising many more columns 322 and SIO lines 355, and the SIO lines 355 can be selectively coupled to more or fewer than 8 sensing components 350. It is noted that, in embodiments comprising a plurality of SIO lines 355, each of the plurality of SIO lines would be selectively coupled to a particular sensing component of a different subset of sensing components 350 via the same column select lines 358-0 to 358-7. For instance, a second SIO line 355 (e.g., SIO line pair 355-1/355-1* not shown in FIG. 3) could be selectively coupled to sensing components 350 corresponding to a next 8 columns of the array 330 (e.g., sensing components 350-8 to 350-15 corresponding to columns 322-8 to 322-15 not shown in FIG. 3). In this example, the decode circuitry could be configured such that activation of column select line 358-0 couples sensing component 350-0 of column 322-0 to SIO line pair 355-0/355-0* and also couples sensing component 350-8 of column 322-8 to SIO line pair 355-1/355-1*.

To further expand the example in which each SIO line 355 is selectively coupled to a subset of 8 different sensing components, activating column select line 358-0 could correspond to coupling columns 0, 8, 16, 24, etc., to respective SIO lines, activating column select line 358-1 could correspond to coupling columns 1, 9, 17, 25, etc., to respective SIO lines, activating column select line 358-2 could correspond to coupling columns 2, 10, 18, 26, etc., to respective SIO lines, activating column select line 358-3 could correspond to coupling columns 3, 11, 19, 27, etc., to respective SIO lines, activating column select line 358-4 could correspond to coupling columns 4, 12, 20, 28, etc., to respective SIO lines, activating column select line 358-5 could correspond to coupling columns 5, 13, 21, 29, etc., to respective SIO lines, activating column select line 358-6 could correspond to coupling columns 6, 14, 22, 30, etc., to respective SIO lines, and activating column select line 358-7 could correspond to coupling columns 7, 15, 23, 31, etc., to respective SIO lines. An example of an array comprising multiple SIO lines is described further in association with FIG. 4A/4B.

Figure 4B:
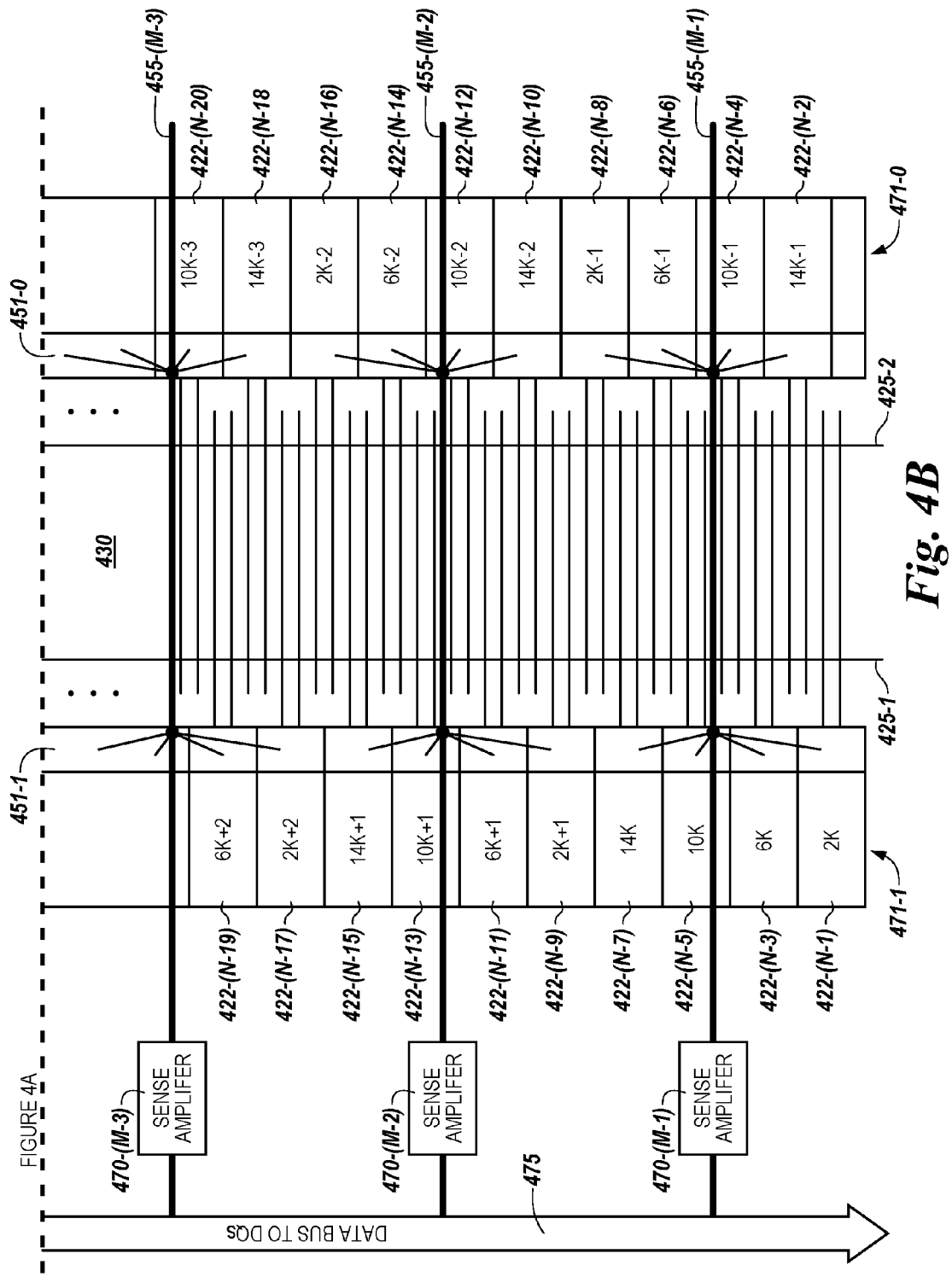
FIG. 4A/4B is a schematic diagram illustrating an example data path in an apparatus in accordance with a number of embodiments of the present disclosure.

FIG. 4A/4B (which may be referred to as FIG. 4) is a schematic diagram illustrating an example data path in an apparatus in accordance with a number of embodiments of the present disclosure. The data path shown in FIG. 4 comprises a plurality of shared I/O (SIO) lines 455-0, 455-1, . . . , 455-(M−1) (referred to generally as SIO lines 455). In this example, each of the plurality of SIO lines 455-0 to 455-(M−1) is coupled to one of a respective plurality of sense amplifiers 470-0 to 470-(M−1). The sense amplifiers 470-0 to 470-(M−1), which can be referred to generally as sense amplifiers 470, can correspond to logic 170 shown in FIG. 1. In operation, data values can be transferred out of array 430 to data I/O pads (e.g., DQs not shown in FIG. 4)

via a bus 475, which is coupled to the sense amplifiers 470. The data can then be transferred to an external processing resource, for example.

The array 430 comprises a plurality of columns 422-0 to 422-(N−1) (referred to generally as columns 422). In the example shown in FIG. 4, the array 430 comprises 16K (e.g., 16,000) columns 422. Each of the columns 422 comprises a pair of complementary sense lines (e.g., 405-0 and 405-0*); however, embodiments are not limited to complementary sense line pairs. The array 430 comprises a plurality of sensing components corresponding to the respective plurality of columns 422 and coupled to the respective sense line pairs. In this example, the array 430 is arranged in a folded and interleaved sense line architecture in which a first plurality of sensing components (referred to generally as sensing component stripe 451-0) correspond to respective even numbered columns 422 (e.g., 422-0, 422-2, 422-4, . . . , 422-(N−2)), and in which a second plurality of sensing components (referred to generally as sensing component stripe 451-1) correspond to respective odd numbered columns 422 (e.g., 422-1, 422-3, 422-5, . . . , 422-(N−1)). In this example, and as shown in FIG. 4, the sensing component stripe 451-0 is located on one side of array 430 (e.g., the right side as shown in FIG. 4), and the sensing component stripe 451-1 is located on the opposite side of array 430 (e.g., the left side as shown in FIG. 4).

In the example shown in FIG. 4, each of the SIO lines 455 is selectively coupled to a subset of the sensing components of stripe 451-0 and to a subset of the sensing components of stripe 451-1. For instance, in this example, each of the SIO lines 455 is selectively coupled to eight sensing components (e.g., four sensing components of stripe 451-0 and four sensing components of stripe 451-1). As such, each of the SIO lines 455 corresponds to eight physically sequential columns 422 of the array (e.g., SIO line 455-0 corresponds to columns 422-0 to 422-7, SIO line 455-1 corresponds to columns 422-8 to 422-15, SIO line 455-(M−1) corresponds to columns 422-(N−8) to 455-(N−1), etc.). That is, each one of the SIO lines 455 is selectively coupled to a respective subset of sensing components of stripe 451-0 and a respective subset of sensing components of stripe 451-1. The stripes 451-0 and 451-1 can comprise sensing components such as sensing components 350 described in association with FIG. 3, for example.

The SIO lines 455 are selectively coupled to the corresponding respective subsets of sensing components of stripes 451-0/451-1 via column select circuitry, which is represented by elements 460-0 to 460-7 in FIG. 4. The column select circuitry, which can be referred to generally as column select circuitry 460, can represent at least a portion of column decode circuitry 152 shown in FIG. 1 and/or column decode circuitry 358/359 shown in FIG. 3. For instance, the column select circuitry 460 can comprise multiplexer circuitry (e.g., an 8 to 1 multiplexer) configured to selectively couple a particular SIO line 455 to one of a subset of eight sensing components corresponding to the particular SIO line 455. As described above in association with FIG. 3, each of the plurality of SIO lines 455 is selectively coupled to the sensing components corresponding to a respective eight columns 422, and the column select circuitry 460 can be configured to selectively couple one sensing component from each of the "M" subsets of sensing components to the corresponding respective "M" SIO lines 455 in parallel.

For instance, in this example, column select circuitry 460-0 can be configured to selectively couple, in parallel, the sensing component corresponding to column 422-0 to SIO line 455-0, the sensing component corresponding to column 422-8 to SIO line 455-1, . . . , and the sensing component corresponding to column 422-(N−8) to SIO line 455-(M−1). The column select circuitry 460-1 can be configured to selectively couple, in parallel, the sensing component corresponding to column 422-1 to SIO line 455-0, the sensing component corresponding to column 422-9 to SIO line 455-1, . . . , and the sensing component corresponding to column 422-(N−7) to SIO line 455-(M−1). The column select circuitry 460-2 can be configured to selectively couple, in parallel, the sensing component corresponding to column 422-2 to SIO line 455-0, the sensing component corresponding to column 422-10 to SIO line 455-1, . . . , and the sensing component corresponding to column 422-(N−6) to SIO line 455-(M−1). The column select circuitry 460-3 can be configured to selectively couple, in parallel, the sensing component corresponding to column 422-3 to SIO line 455-0, the sensing component corresponding to column 422-11 to SIO line 455-1, . . . , and the sensing component corresponding to column 422-(N−5) to SIO line 455-(M−1). The column select circuitry 460-4 can be configured to selectively couple, in parallel, the sensing component corresponding to column 422-4 to SIO line 455-0, the sensing component corresponding to column 422-12 to SIO line 455-1, . . . , and the sensing component corresponding to column 422-(N−4) to SIO line 455-(M−1). The column select circuitry 460-5 can be configured to selectively couple, in parallel, the sensing component corresponding to column 422-5 to SIO line 455-0, the sensing component corresponding to column 422-13 to SIO line 455-1, . . . , and the sensing component corresponding to column 422-(N−3) to SIO line 455-(M−1). The column select circuitry 460-6 can be configured to selectively couple, in parallel, the sensing component corresponding to column 422-6 to SIO line 455-0, the sensing component corresponding to column 422-14 to SIO line 455-1, . . . , and the sensing component corresponding to column 422-(N−2) to SIO line 455-(M−1). The column select circuitry 460-7 can be configured to selectively couple, in parallel, the sensing component corresponding to column 422-7 to SIO line 455-0, the sensing component corresponding to column 422-15 to SIO line 455-1, . . . , and the sensing component corresponding to column 422-(N−1) to SIO line 455-(M−1).

As described further below, in operation, data can be transferred from the sensing components corresponding to columns selected via the column select circuitry 460 to the respective SIO lines 455 (e.g., the sensed data stored in the sensing components can be driven onto the respective SIO lines 455). The data can then be transferred from the SIO lines 455 to a different storage location. For instance, the data driven onto each one of the respective SIO lines 455 can be transferred to a sensing component corresponding to a different selected column (e.g., via the appropriate column select circuitry 460 corresponding to the different selected respective columns 422). The data can then be stored to a memory cell coupled to a selected access line (e.g., 425-1, 425-2) of the array 430 via the corresponding sense lines 405. The different storage location can be external from the array 430. For example, the sense amplifiers 470 can serve as the different storage location; however, embodiments are not so limited.

References 471-0 and 471-1 shown in FIG. 4 indicate the logical indices corresponding to respective columns 422. The example shown in FIG. 4 includes 16K logical indices (e.g., numbered "0" to "16K−1") corresponding to the respective 16K columns 422. That is, each of the "N" physical columns 422, with N being 16K in this example, is assigned a logical index which corresponds to the logical index of data stored in the cells coupled to a particular row (e.g., 425-1, 425-2) of the array 430. As such, the references 471-0 and 471-1 indicate the logical indices of data units (e.g., bits) stored in a row (e.g., 425-1, 425-2) of array 430. As described above, in this example, the data path comprises M SIO lines 455 (where M=N/8) each of the M SIO lines 455 is selectively coupled to sense lines of a subset of eight columns 422. As such, the data stored in one of eight different memory cells can be driven onto each respective SIO line 455 (e.g., via the corresponding sensing components and circuitry 460). Similarly, data on each respective SIO line 455 can be transferred to one of the eight different memory cells (e.g., via the corresponding sensing components and circuitry 460).

In the example shown in FIG. 4, the logical indices of the M particular subsets of the 16K columns 422 assigned to the respective M SIO lines 455 (e.g., 8 columns 422 per SIO 455), as indicated by references 471-0 and 471-1, and therefore the logical indices of the bits stored in a particular row of array 430 are assigned as follows:

For a particular SIO line "M", the eight corresponding logical indices are:

M;
(3N/4)−M−1;
(N/2)−M−1;
(N/4)−M−1;
(N/4)+M;
(N/2)+M;
(3N/4)+M; and
N−M−1;

Recalling that N=16K in this example, the eight physical columns 422 selectively coupled to the first SIO line 455-0 (e.g., physical columns 422-0 to 422-7) are assigned respective logical indices "0," "16K−1," "4K," "12K−1," "8K," "8K−1," "12K," and "4K−1" (as indicated at references 470-0 and 470-1). Similarly, the eight physical columns 422 selectively coupled to the last SIO line 455-(M−1) (e.g., physical columns 422-(N−8) to 422-(N−1)) are assigned respective logical indices "2K−1," "14K," "6K−1," "10K," "10K−1," "6K," "14K−1," and "2K." Embodiments are not limited to logical index assignments shown in FIG. 4.

A number of embodiments of the present disclosure can include reversing a data pattern stored in an array (e.g., a data pattern stored in a particular row 425-1 of array 430) by performing a plurality of transfer operations via the SIO lines 455. As described further below, performing the transfer operations can include transferring data between subsets of the sensing components of stripe 451-0 and respective subsets of the sensing components of stripe 451-1. Transferring data between subsets of sensing components of stripe 451-0 and subsets of sensing components of stripe 451-1 can be referred to as "swapping" data.

As an example, consider a 16K bit data pattern (e.g., bit-vector) stored in the memory cells commonly coupled to a particular row (e.g., access line 425-1). The 16K data pattern stored in the particular row can be reversed and the reversed data pattern can be stored back to array 430 (e.g., the reversed data pattern can be written to the particular row such that the data previously stored in the particular row is replaced and/or the reversed data pattern can be written to a row other than the particular row). Reversing the stored data pattern can include sensing a first subset of the cells coupled to a particular row (e.g., access line 425-1 in this example). The first subset of cells can comprise those cells of the columns 422 coupled to respective SIO lines 455 in parallel via column select circuitry 460-0 (e.g., cells corresponding to columns 422-0, 422-8, ..., 422-(N−8)). In this example, the first subset of cells comprises 2K cells (e.g., 2K bits) since there are 2K SIO lines 455 (e.g., M=2K since there are 16K columns 422 and each SIO line 455 is selectively coupled to eight sensing components 451-0/451-1 such that (16K columns)/(8 columns/SIO line)=2K SIO lines). Sensing the first subset of cells can include storing the data values of the first subset of cells in respective latches (e.g., sense amplifier latch and/or compute component latch) of the sensing components 451-0 corresponding to the respective 2K columns 422. The sensed data of the first subset of cells can be stored in a number of temporary storage locations. For instance, the sensed data corresponding to the first subset of cells can be written (e.g., at least temporarily) to memory cells corresponding to the same respective 2K columns but commonly coupled to a different access line (e.g., cells corresponding to columns 422-0, 422-8, ..., 422-(N−8) but commonly coupled to access line 425-2). Embodiments are not limited to a particular temporary storage location. For example, the temporary storage locations could include sense amplifiers 470, among other temporary storage locations suitable for storing sensed data corresponding to the first subset of cells.

Reversing the stored data pattern can include subsequently sensing a second subset of the cells (e.g., an additional 2K cells corresponding to 2K bits) coupled to the access line 425-1. The second subset of cells can comprise those cells of the columns 422 coupled to respective SIO lines 455 in parallel via column select circuitry 460-1 (e.g., cells corresponding to the 2K columns 422-1, 422-9, ..., 422-(N−7)). Sensing the second subset of cells can include storing the data values of the second subset of cells in respective latches (e.g., sense amplifier latch and/or compute component latch) of the sensing components 451-1 corresponding to the respective columns 422. The data of the second subset of cells can be transferred, via the 2K SIO lines 455-0 to 455-(M−1), from the respective sensing components 451-1 (e.g., the sensing components corresponding to columns 422-1, 422-9, ..., 422-(N−7)) to the respective sensing components 451-0 corresponding to the first subset of cells (e.g., the sensing components 451-0 corresponding to columns 422-0, 422-8, ..., 422-(N−8)). The data of the second subset of cells can then be written, from the respective sensing components 451-0, to the memory cells of a target row (e.g., to row 425-1 and/or to a different row of array 430 to which the reversed data pattern is to be stored).

The 2K bits corresponding to the first subset of cells, which was stored in the temporary storage locations can be sensed by the sensing components of stripe 451-0 corresponding to the first subset of columns 422 (e.g., 422-0, 422-8, ..., 422-(N−1), and can be transferred, via the 2K SIO lines 455-0 to 455-(M−1), from the respective sensing components 451-0 to the respective sensing components 451-1 corresponding to the second subset of cells (e.g., the sensing components 451-1 corresponding to columns 422-1, 422-9, ..., 422-(N−7)). The data of the first subset of cells can then be written, from the respective sensing components 451-1, to the memory cells of the target row. In this manner, the 2K bits of data stored in cells corresponding to the first subset of columns 422 (e.g., 2K even numbered columns corresponding to stripe 451-0) are swapped with 2K bits of data stored in cells corresponding to the second subset of columns 422 (e.g., 2K odd numbered columns corresponding to stripe 451-1).

As such, the logical indices corresponding to the data values stored in the target row are reversed as compared to the logical indices of the data in the particular row (e.g., 425-1). For instance, the data value previously stored in a cell corresponding to logical column "0" (e.g., physical column 422-0) is stored in a cell coupled to the target row and corresponding to logical column "16K−1" (e.g., physical column 422-1), and the data value previously stored in a cell corresponding to logical column "16K−1" (e.g., physical column 422-1) is stored in a cell coupled to the target row and corresponding to logical column "0" (e.g., physical column 422-0). The data value can be held temporarily by sense amplifiers 470-0 to 470-(M−1) to transfer the data value. As such, the data value formerly corresponding to the first logical index (e.g., "0") corresponds to the last logical index (e.g., "16K−1") and vice versa. Similarly, the data value previously stored in a cell corresponding to logical column "1" (e.g., physical column 422-8) is stored in a cell coupled to the target row and corresponding to logical index "16K−2" (e.g., physical column 422-9), and the data value previously stored in a cell corresponding to logical column "16K−2" (e.g., physical column 422-9) is stored in a cell coupled to the target row and corresponding to logical column "1" (e.g., physical column 422-8). As such, the data value formerly corresponding to the second logical index (e.g., "1") corresponds to the next to last logical index (e.g., "16K−2") and vice versa.

The transfer operations described above and involving swapping the data stored in the first and second subsets of cells (e.g., 4K cells total) can be repeated for the remaining 12K cells of the row such that the entire row (e.g., 425-1) is reversed. For instance, in this example, transfer operations can be performed to swap the data stored in a subset of cells of columns coupled to respective SIO lines 455 in parallel via column select circuitry 460-2 (e.g., even numbered columns 422-2, 422-10, . . . , 422-(N−6)) with the data stored in a subset of cells of columns coupled to respective SIO lines 455 in parallel via column select circuitry 460-3 (e.g., columns 422-3, 422-11, . . . , 422-(N−5)). Transfer operations can also be performed to swap the data stored in a subset of cells of columns coupled to respective SIO lines 455 in parallel via column select circuitry 460-4 (e.g., even numbered columns 422-4, 422-12, . . . , 422-(N−4)) with the data stored in a subset of cells of columns coupled to respective SIO lines 455 in parallel via column select circuitry 460-5 (e.g., columns 422-5, 422-13, . . . , 422-(N−3)). Lastly, transfer operations can also be performed to swap the data stored in a subset of cells of columns coupled to respective SIO lines 455 in parallel via column select circuitry 460-6 (e.g., even numbered columns 422-6, 422-14, . . . , 422-(N−2)) with the data stored in a subset of cells of columns coupled to respective SIO lines 455 in parallel via column select circuitry 460-7 (e.g., columns 422-7, 422-15, . . . , 422-(N−1)). Therefore, in some embodiments, the number of swaps performed in order to reverse the entire row of data can be N/2M (e.g., the number of columns 422 divided by two times the number of SIO lines 455). As such, in this example in which the array 430 comprises 16K columns 422 and 2K SIO lines 455, reversing the entire row (e.g., 425-1) involves 4 swaps.

An example of the logical indices of the data values stored in an entire row of the array before and after reversing in accordance with a number of embodiments of the present disclosure is described below in association with FIG. 5. The reversed data pattern can be read out of the array (e.g., to external processing circuitry) via peripheral sense amps 470-0 to 470-(M−1). For instance, in this example, the column select circuitry 460 can be operated to drive 2K bits onto the 2K SIO lines 455-0 to 455-(M−1), the data can be latched by the respective sense amplifiers 470-0 to 470-(M−1), and can be moved to DQ pads via data bus 475. As such, embodiments of the present disclosure can facilitate reversal of relatively large data sets (e.g., bit-vectors) in a more efficient manner than various previous approaches, which may require bit, byte, and word actions within a host processor, for example, in order to perform data reversals.

FIG. 5 provides tables illustrating logical indices of data stored in an array before and after reversing data stored in memory in accordance with a number of embodiments of the present disclosure. Row 596-1 of Table 590-1 indicates the indices of a number of data units (e.g., bits) $D_0$ to $D_{N-1}$ prior to being reversed, and Row 596-2 of Table 590-2 indicates the indices of the number of data units $D_0$ to $D_{N-1}$ after being reversed in accordance with a number of embodiments of the present disclosure.

Row 592 of tables 590-1 and 590-2 indicate the physical column numbers 0, 1, . . . , (N−1) corresponding to an array (e.g., array 430 shown in FIG. 4). Row 594 of tables 590-1 and 590-2 indicate the logical indices assigned to the respective physical columns (e.g., columns 422 shown in FIG. 4). In this example, there are 16K physical columns (e.g., N=16K) each assigned one of a respective 16K logical indices (e.g., 0, 1, . . . , (16K−1)). The logical indices assigned to the columns remain the same before and after reversing the data of a particular row.

As shown in row 596-1 of table 590-1, prior to reversing the data each of the bits $D_0$ to $D_{N-1}$ are stored in cells corresponding to respective physical columns 0 to (N−1). As such, prior to reversing the data, bit $D_0$ is stored in a cell corresponding to physical column "0," which is assigned logical index "0" (e.g., a first logical index in the 16K sequence), bit $D_1$ is stored in a cell corresponding to physical column "1," which is assigned logical index "16K−1" (e.g., the last logical index in a 16K sequence), bit $D_2$ is stored in a cell corresponding to physical column "2," which is assigned logical index "4K," . . . , and bit $D_{N-1}$ is stored in a cell corresponding to physical column "N−1," which is assigned logical index "2K."

Row 596-2 of table 590-2 illustrates the logical indices of bits $D_0$ to $D_{N-1}$ after being reversed in accordance with embodiments described herein. For example, after being reversed, bit $D_0$ is stored in a cell corresponding to physical column "1," which is assigned logical index "16K−1," and bit $D_1$ is stored in a cell corresponding to physical column "0," which is assigned logical index "0". As such, bit $D_0$ goes from being the first bit in the data pattern (e.g., logical index "0" prior to reversal to being the last bit in the data pattern (e.g., logical index "16K−1" after reversal. In this example, the logical indices are assigned to the physical columns such that swapping the data values stored in adjacent physical columns (e.g., physical columns 0/1, physical columns 2/3, . . . , physical columns (N−2)/(N−1)) results in reversing the stored data pattern. As described above, the even numbered physical columns (e.g., 0, 2, . . . , (N−2)) can correspond to columns coupled to sensing components of a stripe on one side of an array, and the odd numbered physical columns (e.g., 1, 3, . . . , (N−1)) can correspond to columns coupled to sensing components of a stripe on an opposite side of the array (e.g., with each of a plurality of shared I/O lines being coupled to sensing components of a respective subset of the even numbered columns and to sensing components of a corresponding respective subset of the odd numbered columns).

Figure 6:
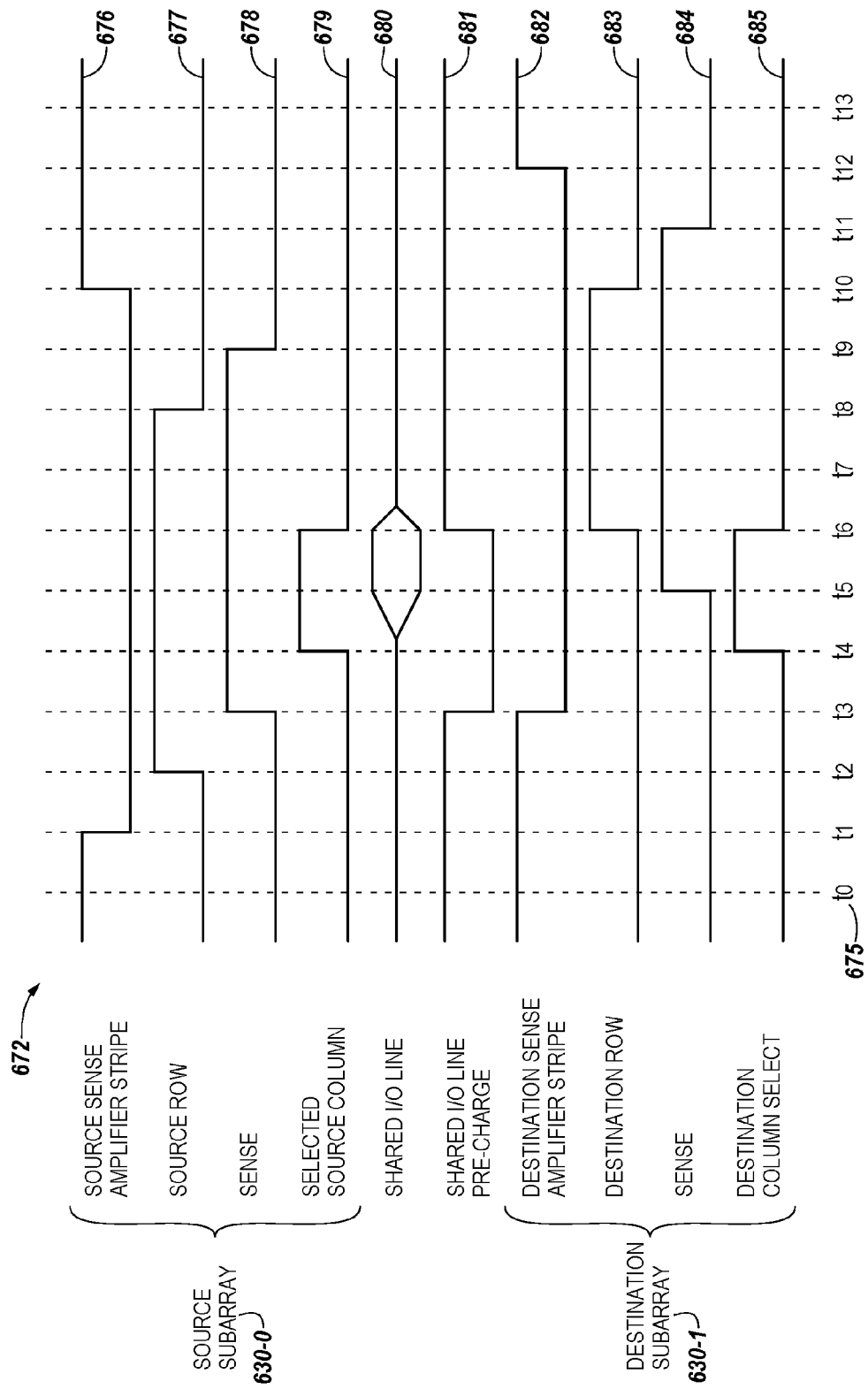
FIG. 6 is a timing diagram associated with reversing data stored in memory in accordance with a number of embodiments of the present disclosure.

FIG. 6 is a timing diagram 672 associated with reversing data stored in memory in accordance with a number of embodiments of the present disclosure. The timing diagram 672 provides an example of a sequence of signals to perform transfer operations as described herein. The signals (e.g., 676, 677, 678, 679, 680, 681, 682, 683, 684, and 685) illustrated in FIG. 6 can be provided to the corresponding components (e.g., access lines, sense lines, sense amplifiers, compute components, etc.) via a controller such as controller 140 shown in FIG. 1, for example. A time scale 675 provides a number of times $t_0, t_1, t_2, \ldots, t_{13}$ associated with transferring data in accordance with this example.

The example provided in FIG. 6 illustrates signals associated with transferring data between subarrays (e.g., between a subarray 630-0 and a subarray 630-1). However, embodiments are not limited to this example. For instance, a number of embodiments can include transferring data to different sensing components within a particular subarray (e.g., subarray 630-0 and 630-1 can be the same subarray). The subarrays 630-0 and 630-1 can be a subarray such as array 430 shown in FIG. 4.

As shown in FIG. 6, at ti signal 676 goes low to enable a pre-charge of the source sense amplifier stripe (e.g., stripe 451-0, 451-1 shown in FIG. 4) of the source subarray 630-0 in association with sensing (e.g., reading) stored data. At $t_2$ signal 677, which is provided to a selected source row (e.g., access line) goes high to enable a read to be performed on the memory cells of the selected row. At $t_3$ the sensing components (e.g., sensing components 350 shown in FIG. 3) corresponding to those cells of the source row being read are activated (e.g., fired), as indicated by signal 678 going high. Firing the sensing components via signal 678 latches the data values in the corresponding sensing components. At $t_4$ a signal 679 goes high to drive the latched data onto the shared I/O lines (e.g., SIO lines 355 shown in FIG. 3, SIO lines 455 shown in FIG. 4). Signal 679 corresponds to a selected one of multiple column select signals (e.g., column select signals corresponding to column select circuitries 460-0 to 460-7 shown in FIG. 4).

Upon activation of signal 679, the voltages on the shared I/O lines (or complementary shared I/O line pair) changes (e.g., as a voltage corresponding to a particular data value is driven from the sensing components onto the respective SIO lines via the column select circuitry) as indicated by signal 680 between times $t_4$ and $t_5$. The data value on each SIO line can then be transferred to a sensing component corresponding to a particular column in the destination subarray 630-1.

For instance, at $t_4$ the signal 685 goes high, which couples the SIO lines to the selected destination columns via the corresponding column select circuitry. As shown at $t_5$, the sensing components coupled to the corresponding selected destination columns are fired as indicated by signal 684 going high. Firing the sensing components results in latching the data on the SIO lines in the corresponding sensing components. Then, the destination row can be activated (e.g., opened), as indicated by signal 683 going high, to transfer the latched data from the sensing components to the corresponding cells of the destination row.

Also shown in FIG. 6 is a signal 681, which corresponds to pre-charging the shared I/O lines, and signal 682, which corresponds to pre-charging the destination sensing component stripe. As described above, in a number of embodiments, the source row can be a same row as the destination row.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells;
a first plurality of sensing components corresponding to a respective first plurality of columns of the array;
a second plurality of sensing components corresponding to a respective second plurality of columns of the array;
a plurality of shared input/output (SIO) lines, wherein each one of the plurality of SIO lines is selectively coupled to a respective subset of the first plurality of sensing components and to a respective subset of the second plurality of sensing components; and
a controller configured to control reversing a logical sequence of data stored in a group of memory cells coupled to a first access line of the array by performing a plurality of transfer operations via the plurality of SIO lines.

2. The apparatus of claim 1, wherein performing the plurality of transfer operations comprises transferring data between subsets of the first plurality of sensing components and respective subsets of the second plurality of sensing components.

3. The apparatus of claim 1, further comprising a plurality of temporary storage locations including a plurality of memory cells coupled to a third access line of the array and coupled to respective columns of a first subset of the first plurality of columns.

4. The apparatus of claim 1, further comprising a second access line, wherein the first access line and the second access line are a same access line such that, subsequent to performing the plurality of transfer operations, the logical sequence of the data stored in the group of memory cells is reversed.

5. The apparatus of claim 1, wherein the first plurality of sensing components and the second plurality of sensing components each comprise a sense amplifier and a compute component formed on pitch with the array.

6. The apparatus of claim 1, wherein the controller is configured to:
sense data stored in the subset of the first plurality of memory cells, the subset of the first plurality of memory cells comprising memory cells each corresponding to one of the respective first plurality columns;

transfer the data sensed from the subset of the first plurality of memory cells to memory cells coupled to the access line of the array;

sense data stored in the subset of the second plurality of memory cells, the subset of the second plurality of memory cells comprising memory cells each corresponding to one of the respective second plurality of columns, the columns to which the subset of the second plurality of memory cells correspond being different columns than the columns to which the subset of the first plurality of memory cells correspond; and transfer, via the SIO lines, the data sensed from the subset of the second plurality of cells to sensing components corresponding to the respective first plurality of columns to which the subset of the first plurality of memory cells correspond.

7. The apparatus of claim 6, wherein the respective first plurality of columns includes at least 2,048 columns such that at least 2,048 bits of data are transferred for each of the plurality of transfer operations.

8. The apparatus of claim 6, wherein each of the respective second plurality of columns are associated with a respective pair of complementary sense lines, and wherein the complementary sense lines are arranged in a folded architecture.

9. The apparatus of claim 1, wherein each one of the plurality of SIO lines comprises a pair of complementary SIO lines.

10. An apparatus, comprising:
an array including a first memory cell, a second memory cell, a third memory cell, and a fourth memory cell;
a first shared input/output (SIO) line and a second SIO line;
a first sensing component, a second sensing component, a third sensing component, and a fourth sensing component, wherein each of the first, second, third, and fourth sensing components are coupled to a corresponding first, second, third, and fourth memory cell;
a first select device coupled between the first sensing component and the first SIO line;
a second select device coupled between the second sensing component and the second SIO line;
a third select device coupled between the third sensing component and the first SIO line; and
a fourth select device coupled between the fourth sensing component and the second SIO line, wherein
the first and second memory cells are assigned logical index information in a first logical sequence, and the third and fourth memory cells are assigned logical index information in a second logical sequence opposite to the first logical sequence.

11. The apparatus of claim 10, further comprising:
a controller configured to:
transfer data from the first memory cell to the third memory cell via the first SIO line; and
transfer data from the second memory cell to the fourth memory cell via the second SIO line.

12. The apparatus of claim 10, wherein each of the first, second, third, and fourth sensing components comprises:
a sense amplifier; and
a compute component coupled to the sense amplifier and configured to perform a logical operation.

13. The apparatus of claim 10, further comprising a controller configured to enable the first, second, third, and fourth select devices, such that the first, second, third, and fourth select devices are conductive.

14. The apparatus of claim 10, further comprising a peripheral sense amplifier coupled between the first SIO line and a data bus.

15. The apparatus of claim 10, the third and fourth memory cells are assigned logical index information in a second logical sequence opposite to the first logical sequence without transferring data associated with the first, second, third, or fourth memory cells out of the array.

16. The apparatus of claim 10, wherein the first and second memory cells are coupled a to a first access line of the array, and the third and fourth memory cells are coupled to a second access line of the array.

17. A method, comprising:
sensing, via a first plurality of sensing components each corresponding to one of a respective first plurality of columns of an array, a respective first plurality of memory cells coupled to a first access line of the array, wherein the data stored in the first plurality of memory cells is stored in accordance with a particular logical sequence;
transferring, via a plurality of shared input/output (SIO) lines, the sensed data from the first plurality of sensing components to a second plurality of sensing components each corresponding to one of a respective second plurality of columns of the array, wherein the plurality of shared SIO lines are shared by the first plurality of sensing components and the second plurality of sensing components;
transferring the sensed data from the second plurality of sensing components to a respective second plurality of memory cells coupled to a second access line of the array;
wherein a logical sequence of the data transferred to the second plurality of memory cells is a reverse of the particular logical sequence.

18. The method of claim 17, wherein the sensed data includes all data stored in the memory cells coupled to the source access line.

19. The method of claim 17, wherein each of the plurality of sensing components comprises a sense amplifier and a compute component.

20. The method of claim 17, wherein the source access line and the destination access line are different lines.

21. The method of claim 17, wherein each of the plurality of SIO lines is selectively coupled to a subset of the plurality of sensing components.

22. The method of claim 21, wherein the subset comprises a group of physically adjacent sensing components.

23. The method of claim 17, wherein the particular logical sequence is reversed without transferring the sensed data out of the array and sensing components coupled thereto.

24. A method, comprising:
reversing a logical sequence of data stored in a group of memory cells coupled to a first access line of an array by performing a plurality of transfer operations via a plurality of shared input/output (SIO) lines;
wherein the array comprises a first plurality of sensing components corresponding to a respective first plurality of columns of the array and a second plurality of sensing components corresponding to a respective second plurality of columns of the array; and
wherein each one of the plurality of SIO lines is selectively coupled to a respective subset of the first plurality of sensing components and to a respective subset of the second plurality of sensing components.

25. The method of claim 24, wherein performing the plurality of transfer operations comprises transferring data between subsets of the first plurality of sensing components and respective subsets of the second plurality of sensing components.

26. The method of claim 24, wherein performing the plurality of transfer operations comprises:
- sensing a first subset of the group of memory cells coupled to the first access line of the array, the first subset of the group of memory cells corresponding to a respective first subset of the first plurality of columns;
- storing, in a plurality of temporary storage locations, data sensed from the first subset of the group of memory cells;
- sensing a second subset of the group of memory cells coupled to the first access line of the array, the second subset of the group of memory cells corresponding to a respective first subset of the second plurality of columns;
- transferring, via the plurality of SIO lines, data sensed from the second subset of the group of memory cells to sensing components corresponding to the respective first subset of the first plurality of columns; and
- storing the data transferred to the sensing components corresponding to the respective first subset of the first plurality of columns to a group of memory cells coupled to a second access line of the array and coupled to respective columns of the first subset of the first plurality of columns.

27. The method of claim 26, wherein performing the plurality of transfer operations further comprises:
- transferring, via the plurality of SIO lines, data stored in the plurality of temporary storage locations to sensing components corresponding to the first subset of the second plurality of columns; and
- storing the data transferred to the sensing components corresponding to the first subset of the second plurality of columns to a group of memory cells coupled to the second access line of the array and coupled to respective columns of the first subset of the second plurality of columns.

* * * * *